(12) United States Patent
Takahashi et al.

(10) Patent No.: US 8,476,733 B2
(45) Date of Patent: Jul. 2, 2013

(54) SEMICONDUCTOR ELEMENT AND MANUFACTURING METHOD THEREFOR

(75) Inventors: Kunimasa Takahashi, Osaka (JP); Chiaki Kudou, Osaka (JP)

(73) Assignee: Panasonic Corporation, Osaka (JP)

( * ) Notice: Subject to any disclaimer, the term of this patent is extended or adjusted under 35 U.S.C. 154(b) by 10 days.

(21) Appl. No.: 13/142,659

(22) PCT Filed: Nov. 15, 2010

(86) PCT No.: PCT/JP2010/006698
§ 371 (c)(1),
(2), (4) Date: Jun. 29, 2011

(87) PCT Pub. No.: WO2011/061918
PCT Pub. Date: May 26, 2011

(65) Prior Publication Data
US 2012/0018740 A1 Jan. 26, 2012

(30) Foreign Application Priority Data
Nov. 17, 2009 (JP) .................................. 2009-261764

(51) Int. Cl.
*H01L 27/092* (2006.01)
(52) U.S. Cl.
USPC ............ 257/504; 257/135; 257/263; 257/278
(58) Field of Classification Search
USPC ........... 257/504, E51.005, E29.027, E29.066, 257/E29.265, E29.32, 135, 263, 278
See application file for complete search history.

(56) References Cited

U.S. PATENT DOCUMENTS 5,900,648 A * 5/1999 Harris et al. .................... 257/77
5,976,936 A   11/1999 Miyajima et al.
(Continued)

FOREIGN PATENT DOCUMENTS

JP    05-259443      10/1993
JP    10-308510 A   11/1998
(Continued)

OTHER PUBLICATIONS

International Search Report for corresponding International Application No. PCT/JP2010/006698 mailed Feb. 15, 2011.

*Primary Examiner* — Chuong A Luu
*Assistant Examiner* — Jaehwan Oh
(74) *Attorney, Agent, or Firm* — Renner, Otto, Boisselle & Sklar, LLP

(57) ABSTRACT

A semiconductor device 100 includes: a body region 105 of a first conductivity type placed on a principal surface of a substrate 101; a silicon carbide layer 102 including a drift region 107 of a second conductivity type; a channel layer 115 of the second conductivity type formed by silicon carbide and placed on the body region 105 and the drift region 107 on a surface of the silicon carbide layer 102; a gate insulating film 111 placed on the channel layer 115; a gate electrode 113 insulated from the silicon carbide layer 102 by the gate insulating film 111; a source electrode 116 provided on the silicon carbide layer 102; and a drain electrode 114 provided on a reverse surface of the substrate 101, wherein the source electrode 116 is in contact with the body region 105 and the channel layer 115; and a second conductivity type impurity concentration on a surface of the silicon carbide layer 102 that is in contact with the source electrode 116 is less than or equal to a second conductivity type impurity concentration of the channel layer 115. Thus, it is possible to provide a silicon carbide semiconductor device having a low loss and a desirable switching characteristic.

10 Claims, 10 Drawing Sheets

U.S. PATENT DOCUMENTS

| | | | |
|---|---|---|---|
| 6,091,108 A * | 7/2000 | Harris et al. | 257/339 |
| 6,096,607 A | 8/2000 | Ueno | |
| 6,573,534 B1 | 6/2003 | Kumar et al. | |
| 6,844,227 B2 * | 1/2005 | Kubo et al. | 438/216 |
| 6,940,110 B2 * | 9/2005 | Takahashi et al. | 257/288 |
| 6,995,397 B2 * | 2/2006 | Yamashita et al. | 257/77 |
| 7,230,273 B2 * | 6/2007 | Kitabatake et al. | 257/76 |
| 7,972,915 B2 * | 7/2011 | Chen et al. | 438/174 |
| 8,178,920 B2 * | 5/2012 | Nakamura et al. | 257/330 |
| 2004/0104429 A1 | 6/2004 | Takahashi et al. | |
| 2004/0227169 A1 * | 11/2004 | Kubo et al. | 257/288 |
| 2005/0001217 A1 * | 1/2005 | Kusumoto et al. | 257/77 |
| 2005/0173739 A1 * | 8/2005 | Kusumoto et al. | 257/263 |
| 2006/0108589 A1 * | 5/2006 | Fukuda et al. | 257/77 |
| 2010/0224885 A1 * | 9/2010 | Onose | 257/77 |
| 2010/0224916 A1 * | 9/2010 | Shimizu et al. | 257/288 |
| 2010/0244048 A1 * | 9/2010 | Hayashi et al. | 257/77 |
| 2012/0223338 A1 * | 9/2012 | Mitani et al. | 257/77 |

FOREIGN PATENT DOCUMENTS

| | | |
|---|---|---|
| JP | 11-68097 A | 3/1999 |
| JP | 11-261061 A | 9/1999 |
| JP | 2002-075909 A | 3/2002 |
| JP | 2002-270837 A | 9/2002 |
| JP | 2002-299620 A | 10/2002 |
| JP | 2004-96061 A | 3/2004 |
| JP | 2004-193578 A | 7/2004 |
| JP | 2004-221263 A | 8/2004 |
| JP | 2005-347680 A | 12/2005 |
| JP | 2006-128191 A | 5/2006 |
| WO | 2010/098076 A1 | 9/2010 |

* cited by examiner (a)

(b)

(a)

(b)

(c)

(a)

(b)

SEMICONDUCTOR ELEMENT AND MANUFACTURING METHOD THEREFOR

TECHNICAL FIELD

The present invention relates to a semiconductor device using silicon carbide and a method for manufacturing the same.

BACKGROUND ART

Silicon carbide (SiC) is a semiconductor material that is expected to be applied to next-generation low-loss power devices, etc., as it has a large bandgap than silicon (Si) and has desirable physical properties such as a high breakdown field strength. Silicon carbide has many polytypes such as cubic 3C—SiC and hexagonal 6H—SiC and 4H—SiC. One of these polytypes that is commonly used for producing a practical silicon carbide semiconductor device is 4H—SiC.

When producing a silicon carbide semiconductor device such as a metal-insulator-semiconductor field effect transistor (MISFET), a 4H—SiC substrate whose principal surface substantially coincides with the (0001) Si plane which is perpendicular to a crystal axis, the c-axis, is normally used. An epitaxial growth layer to be an active region of the silicon carbide semiconductor device is formed on the 4H—SiC substrate (hereinafter referred to simply as the "SiC substrate"). An impurity-doped layer whose conductivity type and carrier concentration are controlled depending on the type of the semiconductor device to be produced is formed by ion implantation, or the like, in a selected region of the epitaxial growth layer. The impurity-doped layer functions as a p-type body region (well region) 105 or an n$^+$ source region in a MISFET, for example.

The structure of a MISFET using SiC (SiC-MISFET) is proposed in Patent Document No. 1, for example.

FIG. 8(a) is a schematic plan view showing a portion of a conventional vertical MISFET using SiC, and FIG. 8(b) is a cross-sectional view taken along line I-I' of FIG. 8(a).

As can be seen from FIG. 8(a), a vertical MISFET 400 includes a plurality of unit cells 400U which are typically arranged two-dimensionally. FIG. 8(b) shows portions of two adjacent unit cells 400U.

The unit cell 400U of a vertical MISFET includes a silicon carbide epitaxial layer 402 formed on the principal surface of a low-resistance n-type SiC substrate 401, a channel layer 407 formed on the silicon carbide epitaxial layer 402, a gate electrode 413 formed on the channel layer 407 with a gate insulating film 411 interposed therebetween, a source electrode 412 in contact with the surface of the silicon carbide epitaxial layer 402, and a drain electrode 414 provided on the reverse surface of the SiC substrate 401.

The silicon carbide epitaxial layer 402 includes a body region (well region) 405 having a conductivity type (herein, p-type) that is different from the conductivity type of the SiC substrate 401, and a drift region 402d formed by a portion of the silicon carbide epitaxial layer 402 where the body region 405 is not formed. The silicon carbide epitaxial layer 402 is an n$^-$-type silicon carbide layer containing an n-type impurity at a lower concentration than the SiC substrate 401, for example. The silicon carbide epitaxial layer 402 is formed by epitaxially growing silicon carbide while supplying a dopant that exhibits the n—type conductivity.

An n$^+$-type source region 416 containing an n-type impurity at a high concentration and a p$^+$-type contact region 409 containing a p-type impurity at a higher concentration than the body region 405 are formed inside the body region 405.

The body region 405, the source region 416 and the contact region 409 are formed by a step of implanting an impurity into the silicon carbide epitaxial layer 402, and a high-temperature heat treatment (activation annealing) step of activating the impurity implanted into the silicon carbide epitaxial layer 402. Specifically, a p-type impurity implantation region to be the body region is formed by ion implantation of an impurity (e.g., Al) to be a p-type dopant into the silicon carbide epitaxial layer 402. Then, an n-type impurity implantation region to be the source region and a high-concentration p-type impurity region to be the contact region are formed by ion implantation of an impurity (e.g., nitrogen) to be an n-type dopant and an impurity to be a p-type dopant, respectively, into portions of the p-type impurity implantation region. Then, by performing activation annealing, a source region 408 and the contact region 409 are obtained from the n-type impurity implantation region and the high-concentration p-type impurity region, respectively. A region of the p-type impurity implantation region that is not turned into the source region or the contact region is the body region 405.

The source region 416 and the drift region 402d are connected together via the channel layer 407. The channel layer 407 can be formed by epitaxially growing silicon carbide, while supplying an n-type dopant, on the silicon carbide epitaxial layer 402, for example. Alternatively, it can be formed by implanting ions of an impurity to be an re-type dopant into an epitaxially-grown 4H—SiC layer.

The source electrode 412 forms an ohmic contact with the contact region 409 and the source region 416. Therefore, the body region 405 is electrically connected with the source electrode 412 via the contact region 409. The source electrode 412 can be formed by forming a conductive material (Ni) layer, for example, on the source region 416 and the contact region 409 in the silicon carbide epitaxial layer 402, and then performing a heat treatment at a high temperature.

The gate insulating film 411 is a thermal oxidation film (SiO$_2$ film) formed by thermally oxidizing the surface of the channel layer 407, for example. The gate electrode 413 is formed using conductive polysilicon, for example.

In the SiC-MISFET shown in FIGS. 8(a) and 8(b), a current flow can be conducted through the channel layer 407 which is present under the gate electrode 413 with the gate insulating film 411 interposed therebetween by a voltage applied to the gate electrode 413. Therefore, the current from the drain electrode 414 (the drain current) flows to the source electrode 412 (ON state) through the SiC substrate 401, the drift region 402d, the channel layer 407 and the source region 416.

In an SiC-MISFET, the source electrode is normally an ohmic electrode which is in ohmic contact with the contact region and the source region. For example, Patent Document No. 2 proposes a method for forming an ohmic electrode having a low contact resistance.

On the other hand, Patent Document No. 3 discloses an SiC-MISFET having no source region. FIG. 9 is an enlarged cross-sectional view showing a portion of the SiC-MISFET disclosed in Patent Document No. 3. For the sake of simplicity, like components to those of FIG. 8 are denoted by like reference numerals and will not be described.

The SiC-MISFET shown in FIG. 9 includes, on a silicon carbide epitaxial layer 402, a channel layer 407 having a structure (delta-doped structure) in which δ-doped layers 407b containing an n-type impurity and an undoped layer 407a containing no n-type impurity are alternately layered together. A source electrode (silicide layer) 412 is in contact with the channel layer 407 having a delta-doped structure and a p-type contact region 409.

In this SiC-MISFET, the source electrode 412 is formed by depositing a metal such as nickel on the channel layer 407 and then performing a heat treatment. In this heat treatment, the deposited metal diffuses in the vertical direction (thickness direction) through the channel layer 407. Thus, it is possible to obtain the source electrode 412 which is in contact with the contact region 409.

Patent Document No. 4 discloses a method in which an opening is formed in a channel layer, and an ohmic electrode (source electrode) is formed in the opening (FIG. 7 of Patent Document No. 4).

FIG. 10 is an enlarged cross-sectional view showing a portion of the SiC-MISFET disclosed in Patent Document No. 4. For the sake of simplicity, like components to those of FIG. 8 are denoted by like reference numerals and will not be described.

The SiC-MISFET shown in FIG. 10 is formed as follows. First, a channel layer 407 and an interlayer insulating film 430 are formed on a silicon carbide epitaxial layer 402 including a body region 405 and a source region 416. Then, an opening is formed by etching in the interlayer insulating film 430, the channel layer 407 and the source region 416. An aluminum alloy is deposited in the opening to obtain an ohmic electrode (source electrode) 412 in contact with the source region 416 and the body region 405.

CITATION LIST

Patent Literature

Patent Document No. 1: Japanese Laid-Open Patent Publication No. 10-308510
Patent Document No. 2: Japanese Laid-Open Patent Publication No. 2002-75909
Patent Document No. 3: Japanese Laid-Open Patent Publication No. 2004-96061
Patent Document No. 4: Japanese Laid-Open Patent Publication No. 11-068097

SUMMARY OF INVENTION

Technical Problem

A study by the present inventors has revealed that the switching speed is slower than a speed that is expected from the physical properties of SiC in such conventional SiC-MISFETs as disclosed in Patent Document Nos. 1-5. It is believed that the parasitic resistance occurring in the body region 405 generates a potential difference in the body region 405, thereby deteriorating the switching characteristic in the ON/OFF operation, as will be later described in detail.

The present invention has been made in view of the above, and an object thereof is to provide a silicon carbide semiconductor device in which the switching speed is increased while suppressing the ON resistance.

Solution to Problem

A semiconductor device of the present invention includes: a substrate including a principal surface and a reverse surface; a silicon carbide layer placed on the principal surface of the substrate, including a body region of a first conductivity type placed in a surface region of the silicon carbide layer, and a drift region of a second conductivity type; a channel layer of the second conductivity type formed by silicon carbide and placed on the body region and the drift region on a surface of the silicon carbide layer; a gate insulating film placed on the channel layer; a gate electrode insulated from the silicon carbide layer by the gate insulating film; a source electrode provided on the silicon carbide layer; and a drain electrode provided on the reverse surface of the substrate, wherein: the source electrode is in contact with the body region and the channel layer; and a second conductivity type impurity concentration on a surface of the silicon carbide layer that is in contact with the source electrode is less than or equal to a second conductivity type impurity concentration of the channel layer.

A method for manufacturing a semiconductor device of the present invention includes the steps of: preparing a substrate with a silicon carbide layer of a second conductivity type formed on a principal surface thereof; ion-implanting an impurity of a first conductivity type into the silicon carbide layer, thereby forming a body region of the first conductivity type, leaving a region of the silicon carbide layer where the body region is not formed as a drift region of the second conductivity type; forming a channel layer of the second conductivity type formed by silicon carbide, a gate insulating film, and a gate electrode in this order on a portion of the body region and the drift region; forming a protection film covering the gate insulating film and the gate electrode; forming a metal film on a surface of the silicon carbide layer with the protection film formed thereon so as to be in contact with a side wall of the channel layer and the body region; and allowing a metal of the metal film and silicon carbide of the channel layer and the body region to react with each other, thereby obtaining a source electrode containing a metal silicide, wherein a second conductivity type impurity concentration on a surface of the silicon carbide layer that is in contact with the source electrode is less than or equal to a second conductivity type impurity concentration of the channel layer.

Advantageous Effects of Invention

With the semiconductor device using silicon carbide of the present invention, since the channel layer and the source electrode are in contact with each other, it is not necessary to form a high-concentration region of the second conductivity type (the source region) for connecting the channel layer and the source electrode with each other, and the second conductivity type impurity concentration on the surface in contact with the source electrode is set to be less than or equal to the second conductivity type impurity concentration of the channel layer. Thus, since the second conductivity type impurity region having a high concentration is not formed in the body region of the first conductivity type, it is possible to eliminate the parasitic resistance occurring in the body region due to a depletion layer extending from a PN junction between the body region and a high-concentration second conductivity type region. By providing the source electrode so as to be in contact with the body region, it is possible to suppress the parasitic resistance without increasing the ON resistance. Therefore, it is possible to provide a semiconductor device with a low loss and a high switching speed.

Particularly, it is preferred that the body region and the source electrode are in contact with each other in the vicinity of the channel layer (channel formation region). Then, it is possible to stabilize the potential of the body region in the vicinity of the channel layer, and it is therefore possible to more effectively reduce the parasitic resistance.

With the manufacturing method of the present invention, it is possible to manufacture the semiconductor device described above without complicating the process.

DESCRIPTION OF EMBODIMENTS

As described above, it is difficult with conventional MISFETs to realize a high switching characteristic. It is believed that the reason is the parasitic resistance occurring in the body region 405. The present inventors made researches on why the parasitic resistance occurs, thus obtaining the following findings.

Figure 8:
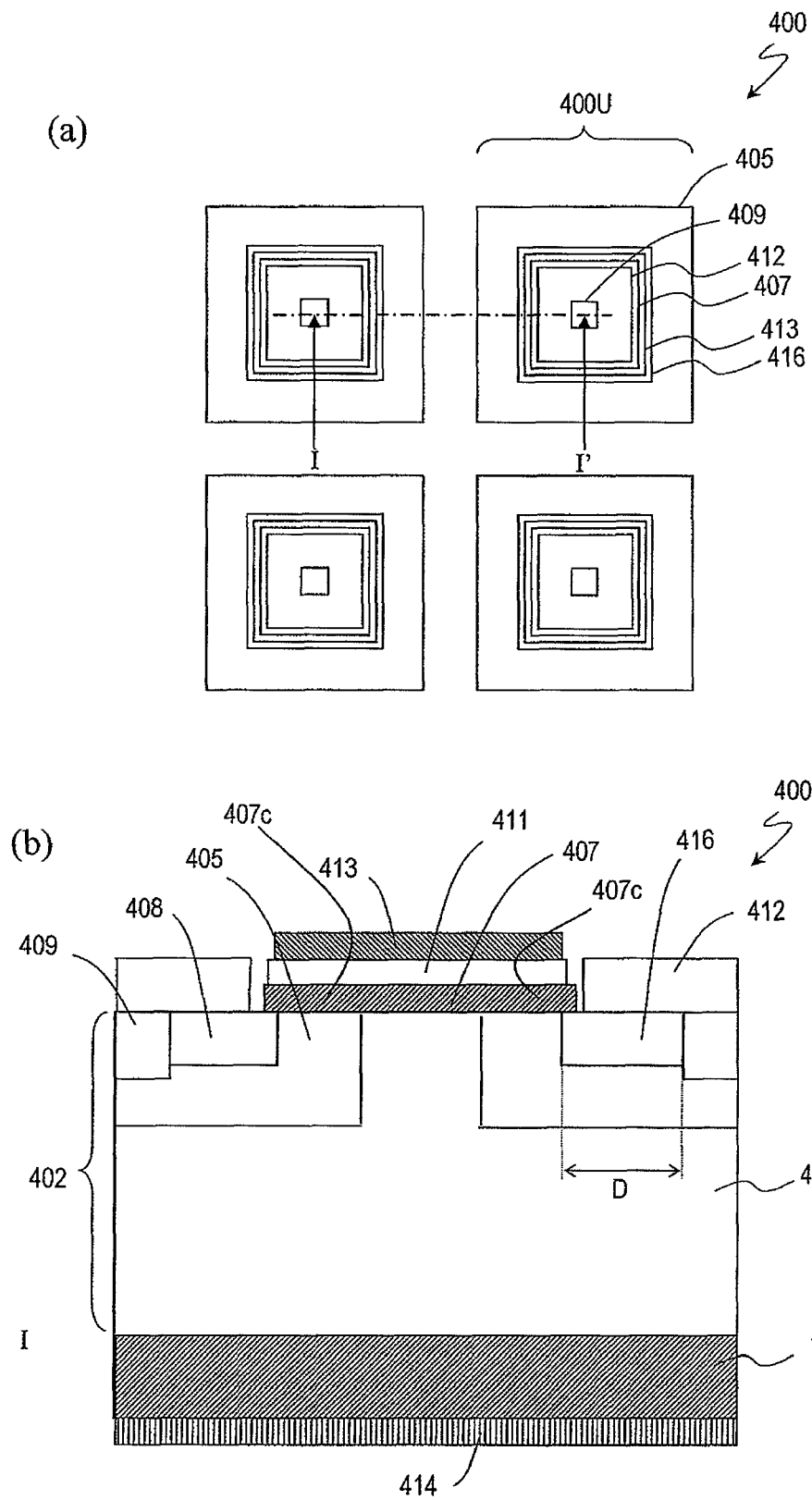
FIGS. 8 (a) and (b) are schematic diagrams illustrating conventional vertical MISFETs using SiC, wherein (a) is a plan view showing a silicon carbide epitaxial layer surface of the conventional vertical MISFET, and (b) is a cross-sectional view taken along line I-I' of (a).

In the SiC-MISFET shown in FIG. 8, the source region 416 is placed so as to be in contact with the body region 405. Therefore, a resistance component is produced as a depletion layer is formed in the body region 405 due to the PN junction between the body region 405 and the source region 416. This resistance component (parasitic resistance) generates a potential difference in the body region 405, thereby deteriorating the switching characteristic in the ON/OFF operation. Similarly, also with the MISFETs disclosed in Patent Document Nos. 2, 4 and 5, a high switching characteristic may not be obtained due to a depletion layer produced from the junction surface between the source region and the body region.

Figure 9:
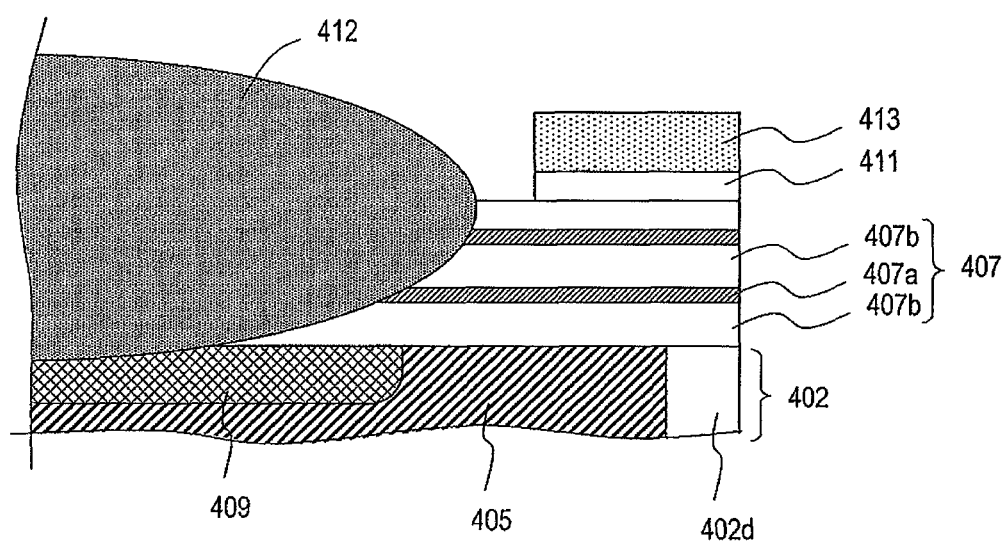
FIG. 9 An enlarged cross-sectional view showing a portion of an SiC-MISFET disclosed in Patent Document No. 3.
Figure 10:
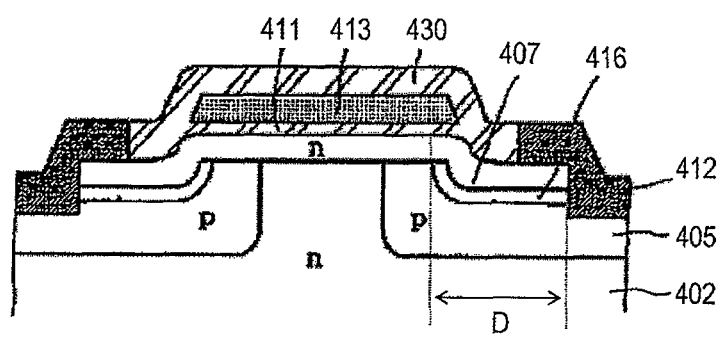
FIG. 10 A cross-sectional view showing an SiC-MISFET disclosed in Patent Document No. 4.

In contrast, in the structure of Patent Document No. 3 shown in FIG. 9, no source region is formed, and therefore a depletion layer is not produced due to the PN junction between the source region 416 and the body region 405.

In the MISFET of Patent Document No. 3, however, since the body region 405 is not in contact with the source electrode, the potential of the body region 405 is unstable, and a potential difference is likely to occur in the body region 405. When a potential difference occurs, the parasitic resistance increases. Moreover, since a gap is provided between the gate insulating film 411 and the source electrode 412, there are cases where a depletion layer is formed, extending from the side of the body region 405, in the channel layer 407 between the gate insulating film 411 and the source electrode 412 even in an ON state where there is a bias applied to the gate electrode 413. Therefore, the depletion layer may become a resistance component, thereby increasing the ON resistance.

With the conventional MISFET shown in FIG. 8, the parasitic resistance in the body region 405 may further increase for the following reason.

Since SiC has a large bandgap, it has a problem that the contact resistance between the contact region 409 of the p-type conductivity and the source electrode 412 is particularly high. If the contact resistance of the p-type contact region 409 is high, the body region 405 is not completely fixed to the reference potential, thereby generating a parasitic resistance.

A parasitic resistance occurs in the body region 405 in accordance with the distance D between the contact region 409 and a portion of the channel layer 407 where the channel is formed (in this example, a portion of the channel layer 407 that is in contact with the body region 405 and located under the gate electrode 413; hereinafter referred to as the "channel formation region") 407c, in a plane parallel to the substrate 401. With the structure shown in FIG. 8, the distance D is generally equal to the distance (the width of the source region 416) between the contact region-side end portion and the body region-side end portion of the source region 416 along the cross section perpendicular to the substrate 401.

Note that with a semiconductor device having the contact region 409, the distance D refers to the distance between the contact region-side end portion of the channel formation region 407c and the channel layer-side end portion of the contact region 409 in a plane parallel to the substrate 401. Where the semiconductor device does not have the contact region 409, the distance D refers to the distance between a region of the body region 405 that is in contact with the source electrode 412 and the channel formation region 407c. In any case, a parasitic resistance occurs in the body region 405 in accordance with the distance D.

For this, Patent Document No. 2, for example, proposes a semiconductor device using silicon carbide, wherein the carrier concentration of the p-type contact region is set to $1 \times 10^{18}$ $cm^{-3}$ or more and AlTi is used as a metal of the ohmic electrode for the purpose of reducing the contact resistance between the p-type SiC region and the ohmic electrode. With the method of Patent Document No. 2, the contact resistance between the p-type contact region and the ohmic electrode can be reduced as compared with conventional techniques. However, it is not possible to reduce the parasitic resistance occurring in accordance with the distance D in the body region 405.

Similarly, also with Patent Document No. 4, a parasitic resistance may occur in accordance with the distance D between a region of the body region 405 that is in contact with the source electrode 412 and the channel formation region 407c. The distance D is generally equal to the width of the source region.

With Patent Document No. 3, since no source region is formed, the distance D can be made shorter than Patent Document Nos. 1, 2, 4 and 5. However, a predetermined gap is provided between the contact region 409 and the gate insulating film 411 in order to prevent the metal forming the source electrode 412 from diffusing to be in contact with the gate insulating film 411 through a heat treatment. Therefore, it is difficult to significantly reduce the parasitic resistance which occurs in accordance with the distance D.

Thus, with the conventional semiconductor devices, it is difficult to sufficiently reduce the parasitic resistance occurring in the body region 405. Therefore, it is difficult to fix the body region 405 in the vicinity of the channel layer 407 to a reference potential. If a potential difference occurs in the body region 405, a parasitic bipolar transistor made up of the source region 416, the body region 405 and the drift region 402d may be turned ON. As a result, there is a transitional current flow through the parasitic bipolar transistor even though the MISFET is OFF, thus deteriorating (slowing down) the switching characteristic in the ON/OFF operation.

Based on these findings, the present inventors found a configuration with which it is possible to effectively reduce the parasitic resistance occurring in the body region, thus arriving at the present invention.

(First Embodiment)

The first embodiment of the semiconductor device of the present invention will now be described with reference to the drawings. The semiconductor device of the present embodiment is a vertical SiC-MISFET having an accumulation channel structure.

FIG. 1(a) is a schematic cross-sectional view showing a semiconductor device 100 of the present embodiment, showing portions of two adjacent unit cells in the semiconductor device. FIG. 1(b) is a top view of one unit cell in the semiconductor device. FIG. 1(c) is a plan view showing an example how a plurality of unit cells are arranged.

Figure 1:
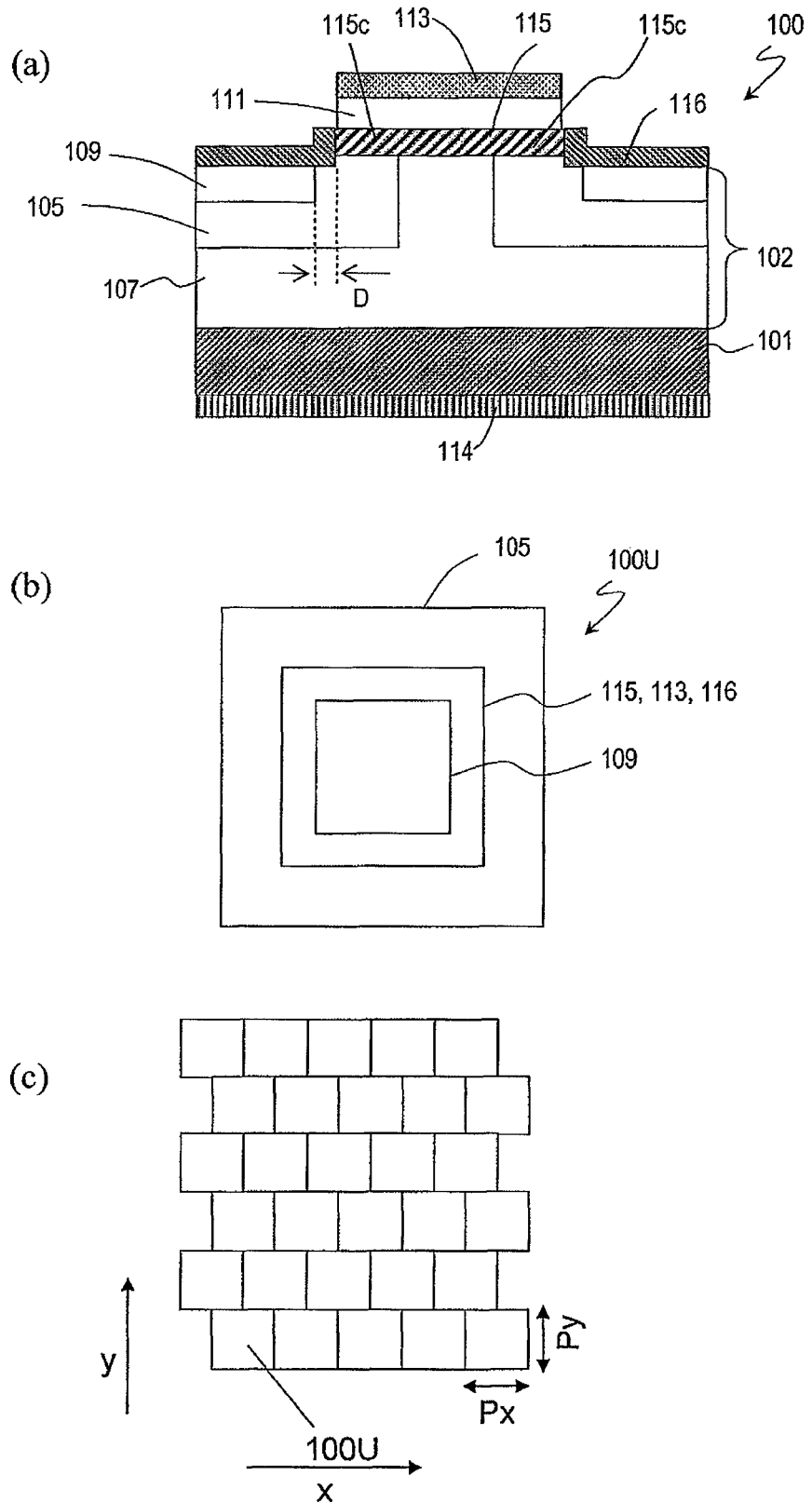
FIG. 1 (*a*)-(*c*) are schematic diagrams illustrating a semiconductor device according to a first embodiment of the present invention, wherein (a) is a cross-sectional view showing portions of two adjacent unit cells, (b) is a plan view showing a silicon carbide layer surface of a unit cell, and (c) is a plan view showing how a plurality of unit cells are arranged in the semiconductor device.
Figure 2:
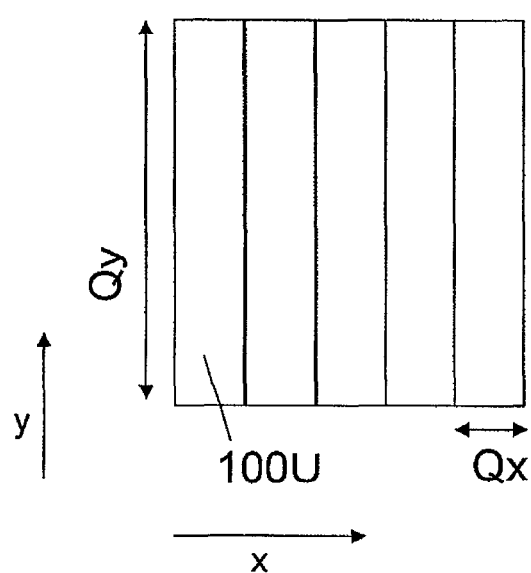
FIG. 2 A plan view illustrating how unit cells are arranged in another semiconductor device of the first embodiment.

In the example shown in FIG. 1, unit cells 100U each have a generally rectangular (or square) shape in plan view, and are arranged two-dimensionally in the x direction and in the y direction perpendicular to the x direction. Note that the unit cells 100U may each have a stripe shape in plan view extending in one direction (e.g., the y direction) as shown in FIG. 2, for example. The repeating unit of the unit cells in the x direction and that in the y direction (the lengths of the unit cell in the x and y directions) are denoted as Px and Py in FIG. 1(c), and the repeating unit of the unit cells in the x direction and that in the y direction are denoted as Qx and Qy in FIG. 2. Px, Py and Qx are each 3 to 20 μm, preferably 5 to 15 μm. Qy is larger than Px, and Qx, and is 20 μm or more. Qy at maximum may be a length (e.g., 5 mm) equivalent to the chip size along one side of a semiconductor device formed by a group of unit cells.

The semiconductor device 100 includes a substrate 101, a silicon carbide layer 102 formed on the principal surface of the substrate 101, a source electrode 116 electrically connected to the silicon carbide layer 102, a gate electrode 113 covering at least a portion of the silicon carbide layer 102, and a drain electrode 114 electrically connected to the reverse surface of the substrate 101. A channel layer 115 and a gate insulating film 111 are formed in this order between the silicon carbide layer 102 and the gate electrode 113.

The substrate 101 is a low-resistance n-type silicon carbide substrate. In the present embodiment, the substrate 101 is an offcut substrate made of 4H—SiC, for example, and having a surface that is inclined by a few degrees (an off angle) from the (0001) Si plane to increase the step density. The off angle is two degrees or more and six degrees or less, for example.

The silicon carbide layer 102 is, for example, silicon carbide epitaxial layer formed on the substrate 101. A plurality of p-type body regions 105 spaced apart from one another corresponding to the unit cells are formed in a surface region of the silicon carbide layer 102. A portion of the silicon carbide layer 102 where the body region 105 is not formed is an n-type drift region 107. The drift region 107 is, for example, an n$^-$-type silicon carbide layer containing an n-type impurity at a lower concentration than the substrate 101. A p$^+$-type contact region 109 electrically connected to the body region 105 and containing a p-type impurity at a higher concentration than the body region 105 is formed inside the body region 105. In the present embodiment, the contact region 109 is placed within the body region 105 as seen from the direction perpendicular to the principal surface of the silicon carbide layer 102. No n$^+$-type source region is formed in the silicon carbide layer 102.

The channel layer 115 is an n-type epitaxial layer formed by 4H—SiC, for example. The channel layer 115 is formed on a portion of the body region 105 and the drift region 107. The channel layer 115 is in contact with the source electrode 116, and is placed so as to connect the source electrode 116 and the drift region 107 with each other. In the present embodiment, the channel layer 115 extends from an end portion of one of two adjacent body regions 105 to an end portion of the other, and is in contact with the surfaces of the two body regions 105 and the surface of the drift region 107 located therebetween. The side wall of the channel layer 115 is in contact with the side wall of the source electrode 116.

The channel layer 115 of the present embodiment is not limited to 4H—SiC, and may be formed by any silicon carbide. In the present specification, "formed by silicon carbide" means that the main component is silicon carbide, and dopants and other impurities may be contained as well as silicon carbide.

Note that where the body region 105 has a rectangular shape in plan view, for example, the term "end portion" of the body region 105 refers to a rectangular peripheral portion 105e as shown in FIG. 7(a). Where it has a stripe shape in plan view, the term refers to an edge portion 105e extending in a direction in which the stripes extend as shown in FIG. 7(b). In other words, the term refers to an edge portion in contact with the drift region 107.

The source electrode 116 is in ohmic contact with the p$^+$-type contact region 109 and is in contact with the body region 105. In the present embodiment, the source electrode 116 is placed within the body region 105 as seen from the direction perpendicular to the principal surface of the silicon carbide layer 102 so as to cover the entire surface of the p$^+$-type contact region 109.

It is preferred that the source electrode 116 of the present embodiment includes a metal silicide layer formed through a reaction between a metal and silicon carbide of the silicon carbide layer 102. Thus, it is possible to suppress the contact resistance between the source electrode 116 and the silicon carbide layer 102. It is preferred that at least one metal of nickel, titanium and aluminum is used as the metal, in which case it is possible to more effectively reduce the contact resistance. Note that the source electrode 116 may have a layered structure of two or more layers made of elements different from each other.

The gate electrode 113 is insulated from the silicon carbide layer 102 and the channel layer 115 by the gate insulating film 111. The gate electrode 113 is placed so as to cover the end portions of two adjacent body regions 105 and the drift region 107 therebetween. In the present embodiment, the gate electrode 113 has a shape generally equal to, or slightly smaller than, the channel layer 115 as seen from the direction perpendicular to the principal surface of the substrate 101. Note that the shape of the gate electrode 113 in plan view is not limited to the illustrated example as long as it overlaps with a portion of the channel layer 115 that is located on the body region 105.

The source electrodes 116 of the unit cells 100U are connected together in parallel connection by an upper wire electrode (not shown). The upper wire electrode and the gate electrode 113 are electrically separated from each other by an interlayer insulating film (not shown). The unit cells 100U are two-dimensionally arranged as shown in FIG. 1(b), and wire pads and terminator structures are added as necessary, thereby forming the semiconductor device (vertical MISFET) 100.

In the vertical MISFET 100 of the present embodiment, a current flow can be conducted through the channel layer 115 which is present under the gate electrode 113 with the gate insulating film 111 interposed therebetween by a voltage applied to the gate electrode 113. Therefore, the current from the drain electrode 114 (the drain current) flows to the source electrode 116 (ON state) through the substrate 101, the drift region 107 and the channel layer 115.

In the present embodiment, since the channel layer 115 and the source electrode 116 directly form an ohmic junction therebetween, it is not necessary to provide source region for connecting them together. With an accumulation channel-type semiconductor device, the "source region" as used herein refers to a semiconductor region of a second conductivity type that is provided for the purpose of reducing the contact resistance between the source electrode and the channel layer, placed so as to connect the source electrode and the channel layer to each other, and containing a second conductivity type impurity at a concentration higher than the channel layer (i.e., having a lower resistance than the channel layer). Note that where the second conductivity type impurity concentration of the channel layer varies depending on the depth and the position, the "source region" refers to a region that contains a second conductivity type impurity at a higher concentration than the average second conductivity type impurity concentration of the channel formation region of the channel layer.

In the semiconductor device 100, no source region is provided in the silicon carbide layer 102. Therefore, the second conductivity type impurity concentration of one surface of the silicon carbide layer 102 that is in contact with the source electrode 116 is less than or equal to the second conductivity type impurity concentration of the channel layer 115. Note that in the illustrated example, surfaces of the silicon carbide layer 102 that are in contact with the source electrode 116 are only semiconductor regions of the first conductivity type (the body region 105 and the contact region 109). The source electrode 116 is not in contact with a semiconductor region containing a second conductivity type impurity at a higher concentration than the channel layer 115.

The semiconductor device of the present embodiment has the following advantages because it does not have the source region.

With a semiconductor device having a source region (e.g., FIG. 8), since a depletion layer extends from the PN junction between the body region and the source region, the effective thickness of the body region is reduced by the thickness of the depletion layer, and the sheet resistance of the body region increases under the source region. As a result, the parasitic resistance R in the body region increases. In contrast, according to the present embodiment, it is possible to eliminate the increase of the parasitic resistance R due to the depletion layer. As a result, it is possible to increase the switching speed as compared with a semiconductor device having a source region.

The reason why the parasitic resistance R in the body region decreases the switching speed will now be described briefly. When the semiconductor device (MISFET) is OFF, depletion layers extending from adjacent body regions into the drift region are connected together. When switching from OFF to ON, if the parasitic resistance R in the body region is high, the speed at which the potential is transmitted from the contact region to the end portion of the body region is low, thereby slowing down the shrinking of the depletion layer formed in the drift region. Therefore, it takes time before the MISFET is completely ON, thereby causing a switching delay.

On the other hand, also when the MISFET switches from ON to OFF, if the parasitic resistance R of the body region is large, the speed at which the potential is transmitted to the end portion of the body region from the contact region is low, and the potential of the body region increases by about 2.7 V, for example, thereby turning ON the parasitic bipolar formed between the source electrode, the body region and the drain electrode, and thus conducting a current flow from the drain electrode to the source electrode. Therefore, it takes time before the MISFET is completely OFF.

Note that in an ON state, the current flows from the drain electrode to the source electrode via the channel layer. When switching from ON to OFF by discontinuing the application of the gate voltage, a current may flow through the body diode formed by the PN junction between the body region and the drift region. In such a case, since a current passes through the body region during the switching operation, the reference potential may vary due to the influence of the parasitic resistance R of the body region. If the reference potential varies while the gate voltage is decreasing to 0 V during the switching operation, the effective voltage applied to the channel layer varies, thereby causing a delay in the amount of time before the current flowing through the channel layer is turned OFF.

Moreover, by not forming the source region, there is also an advantage that the size of the unit cell 100U can be suppressed to be small. For example, Px, Py and Qx shown in FIG. 1(c) can be made 5 μm or less. As a result, it is possible to increase the packing density of the unit cells 100U. Moreover, since it is no longer necessary to perform the ion implantation step for forming the source region, it is possible to simplify the manufacturing process.

With the semiconductor device of the present embodiment, no source region is formed, and it is therefore possible to arbitrarily place the contact region 109 and the gate electrode 113, thereby reducing the distance D between a portion (channel formation region) 115c of the channel layer 115 in which the channel is formed and the contact region 109 as compared with conventional techniques. If the distance D is made small, e.g., less than 500 nm, more preferably less than 200 nm, the parasitic resistance R in the body region 105 can be more effectively reduced. Therefore, it is possible to further increase the switching speed. Note that in the present embodiment, if the distance D is reduced excessively, the contact area between the source electrode 116 and the body region 105 is so small that it may be difficult to sufficiently stabilize the potential of the body region 105. Moreover, taking into consideration the alignment precision between the channel layer 115 and the contact region 109, the distance D is preferably 100 nm or more, for example.

It is preferred that the end portion of the source electrode 116 is in contact with the body region 105. With such a configuration, the source electrode 116 and the body region 105 can be in contact with each other in the vicinity of the end portion (source electrode-side end portion) of the channel layer 115. Therefore, the potential of a portion of the body region 105 that is located in the vicinity of the channel layer 115 can be more reliably stabilized at the reference potential. As a result, it is possible to significantly reduce the parasitic resistance and effectively increase the switching speed. Since the side wall of the channel layer 115 is in contact with the side wall of the source electrode 116 and there is no gap between the gate insulating film 111 and the source electrode 116, it is unlikely that a depletion layer is formed extending from the body region 105 into the channel layer 115, between the gate insulating film 111 and the source electrode 116 in an ON state. Therefore, it is possible to suppress the increase in the ON resistance due to a depletion layer.

Note that the channel layer 115 of the present embodiment may have a generally uniform impurity distribution in a plane parallel to the principal surface of the substrate 101. In such a case, the impurity concentration of the side wall of the channel layer 115 described above is generally equal to the impurity concentration of the channel formation region of the channel layer 115.

Figure 7:
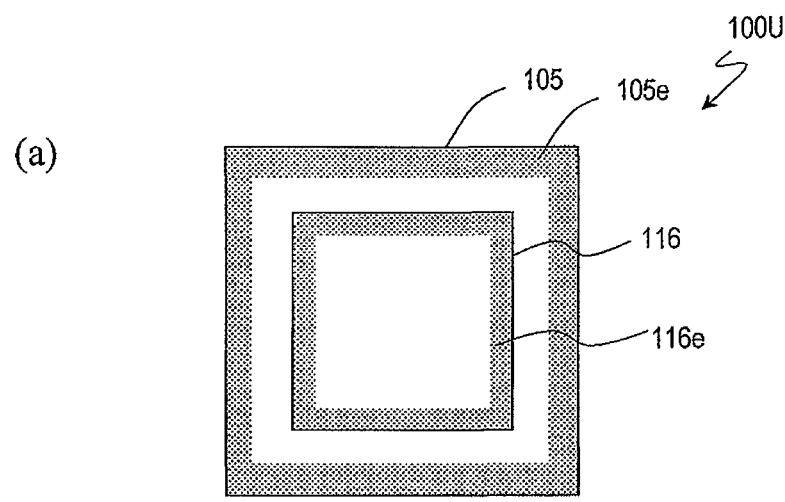
FIGS. 7 (a) and (b) are plan views illustrating the definition of the term "end portion" of the body region and the source region for rectangular-shaped (square-shaped) unit cells and for stripe-shaped unit cells, respectively.
Figure 7:
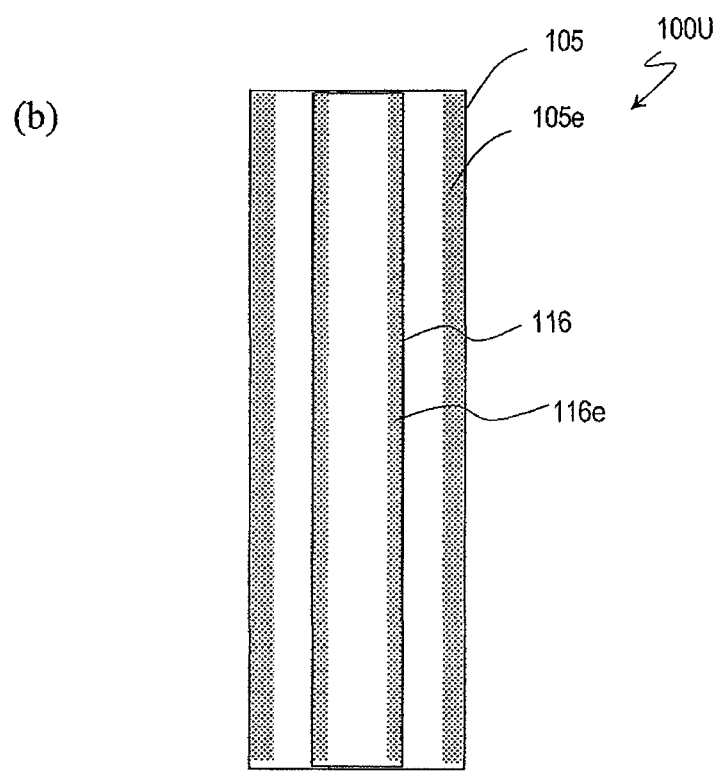

Note that the definition of the "end portion" of the source electrode 116 is similar to the definition of the end portion of the body region 105 described above with reference to FIG. 7. That is, where the source electrode 116 has a rectangular shape in plan view, for example, the term refers to a peripheral portion 116e of the rectangular shape as shown in FIG. 7(a). Where it has a stripe shape in plan view, the term refers to an edge portion 116e extending in a direction in which the stripes extend as shown in FIG. 7(b). That is, in the present embodiment, the term refers to an edge portion in contact with the channel layer 115.

Next, an example of a method for manufacturing the semiconductor device 100 of the present embodiment will be described with reference to the drawings.

First, as shown in FIG. 3(a), the silicon carbide layer 102 is formed by epitaxial growth on the principal surface of a silicon carbide substrate 101, thereby obtaining an epitaxial substrate 103.

The silicon carbide substrate 101 may be, for example, a 4H—SiC substrate whose diameter is 50 mm and whose principal surface has an off angle of about four degrees in the <11-20> orientation from the (0001) Si plane. The n-type carrier concentration of an SiC substrate 101 is $8 \times 10^{18}$ cm$^{-3}$, for example.

The silicon carbide layer 102 is formed by epitaxially growing the silicon carbide layer 102 on the silicon carbide substrate 101 by a CVD method while supplying a silicon carbide material gas together with a dopant gas onto the silicon carbide substrate 101. The material gas may be, for example, monosilane (SiH$_4$) and propane (C$_3$H$_8$). As the dopant gas, an n-type impurity (herein, nitrogen) gas is used. The n-type carrier concentration of the silicon carbide layer 102 is set to about $5 \times 10^{16}$ cm$^{-3}$, for example, and the thickness thereof is set to 10 μm, for example.

Then, as shown in FIG. 3(b), by implanting the surface region of the silicon carbide layer 102 with p-type impurity ions, the body region 105 and the p$^+$-type contact region 109 are formed. A region of the silicon carbide layer 102 where the body region 105 is not formed becomes the drift region 107.

Specifically, first, a mask (not shown) having an opening for exposing a region where the body region is to be formed is formed on the surface of the silicon carbide layer 102. Then, p-type impurity (e.g., aluminum) ions are implanted into the opening of the mask, thereby forming an impurity implantation region to be the body region. Then, p-type impurity (e.g., aluminum) ions are further implanted into a portion of the impurity implantation region to be the body region. Thus, an impurity implantation region to be the contact region is obtained.

Next, a carbon cap layer (not shown) is formed on the surface of the epitaxial substrate 103, and activation annealing is performed in such a state. Thus, the body region 105 is formed in the silicon carbide layer 102, and the p-type contact region 109 having a higher carrier concentration than the body region 105 is formed within the body region 105.

Then, as shown in FIG. 3(c), a semiconductor film 115a to be the channel layer, an insulating film 111a to be the gate insulating film, and a conductive film 113a to be the gate electrode are formed in this order on the silicon carbide layer 102.

In the present embodiment, the semiconductor film 115a to be the channel layer is formed by epitaxial growth performed while supplying nitrogen as the dopant gas. The n-type carrier concentration of the semiconductor film 115a is set to about $1 \times 10^{17}$ cm$^{-3}$, and the thickness thereof is set to about 200 nm. The insulating film 111a to be the gate insulating film is an SiO$_2$ film having a thickness of about 50 nm, and can be formed by thermally oxidizing the surface of the semiconductor film 115a under a temperature of about 1100° C. The conductive film 113a to be the gate electrode can be formed by depositing a phosphorus-doped poly-Si film on the insulating film 111a using a low pressure chemical vapor deposition (LPCVD) apparatus.

Next, as shown in FIG. 3(d), the semiconductor film 115a, the insulating film 111a and the conductive film 113a are patterned by a photolithography technique and a dry etching technique. Thus, the channel layer 115, the gate insulating film 111 and the gate electrode 113 are obtained. The width of the channel layer 115 (the width along the channel direction) in the present embodiment is set to be larger than the width of the gate insulating film 111 and the gate electrode 113. The difference therebetween is greater than or equal to the thickness of the protection film to be formed in a subsequent step (e.g., greater than or equal to 100 nm).

Then, as shown in FIG. 4(a), a protection film 118 is deposited so as to cover the side surface and the upper surface of the gate insulating film 111 and the gate electrode 113. The protection film 118 is not formed on the side wall of the channel layer 115 and on a region of the silicon carbide layer 102 where the channel layer 115 is not formed. The protection film 118 can be formed by depositing an oxidation film (thickness: 100 nm, for example), for example, across the surface of the epitaxial substrate 103, and patterning the oxidation film. Then, a metal film 117 is deposited across the surface of the epitaxial substrate 103 with the protection film 118 formed thereon. The metal film 117 is a nickel film, for example. The thickness of the metal film 117 is preferably 50 nm or more and 200 nm or less. The method of deposition of the metal film 117 is not limited to any particular method. Note that in the present embodiment, a nickel film is formed by depositing nickel across the surface of the epitaxial substrate 103 using an electron beam (EB) deposition apparatus.

Then, as the epitaxial substrate 103 is heated, the metal (nickel) of the metal film 117 diffuses into portions of the silicon carbide layer 102 and the channel layer 115 that are not covered by the protection film 118 to be silicified. The heating temperature is set to 400° C. or more and 1000° C. or less, for example. As a result, as shown in FIG. 4(b), the metal (nickel) of the metal film 117 and the silicon carbide of the silicon carbide layer 102 and the channel layer 115 react with each other, thereby obtaining the source electrode 116 made of a metal silicide (herein, nickel silicide). Then, the metal which remains unsilicified (unreacted metal), the protection film 118 and the metal film 117 deposited thereon are removed.

In the present embodiment, silicon carbide in the vicinity of the side wall of the channel layer 115 and in the vicinity of the surface of the body region 105 and the p$^+$-type contact region 109 of the silicon carbide layer 102 and nickel react with each other. As a result, an ohmic contact is formed with the p$^+$-type contact region 109 whose impurity concentration is high, and the source electrode 116 in contact with the channel layer 115 and the body region 105 is obtained.

With the manufacturing method described above, the source electrode 116 may also come into ohmic contact with the channel layer 115 or the body region 105. It is not necessary that the source electrode 116 is formed only of a metal silicide. For example, only the surface portion of the source electrode 116 on the side of the silicon carbide layer 102 may be a metal silicide, with the remaining portion being a metal layer.

The method for manufacturing the semiconductor device 100 of the present embodiment is not limited to the method described above. Although the gate insulating film 111 is a thermal oxide ($SiO_2$) film formed by thermally oxidizing the epitaxial layer 102 in the method described above, it may be a film obtained by layering together an $SiO_2$ film, etc., deposited by a CVD method.

A metal film having a layered structure may be used as the metal film 117. A two-layer metal film including a Ti film as the lower layer and an Al film as the upper layer, for example, may be formed. Then, a heat treatment is performed (temperature: 500° C., for example). Thus, the metals of the upper layer and the lower layer are silicified, thereby obtaining the source electrode 116 having a layered structure made of two layers containing metals different from each other.

While the thickness of the channel layer 115 in the present embodiment is not limited to any particular thickness, it is preferably 100 nm or more in order to ensure a sufficient contact area with the source electrode 116. On the other hand, if the channel layer 115 is excessively thick, the threshold voltage of the SiC-MISFET is so low that it has a normally-OFF characteristic. Therefore, it is preferably 300 nm or less.

Although the thickness of the metal silicide layer in the source electrode 116 is not limited to any particular thickness, it is preferably 100 nm or more so as to suppress the contact resistance between the source electrode 116 and the $p^+$-type contact region 109 and the channel layer 115 to be small. The thickness of the metal silicide layer is determined by reaction conditions such as the thickness of the metal film 117 (FIG. 4($a$)), the heating temperature, etc. Typically, a metal silicide layer is formed with a thickness about twice as large as that of the metal of the metal film 117 that is used in the reaction.

Figure 3:
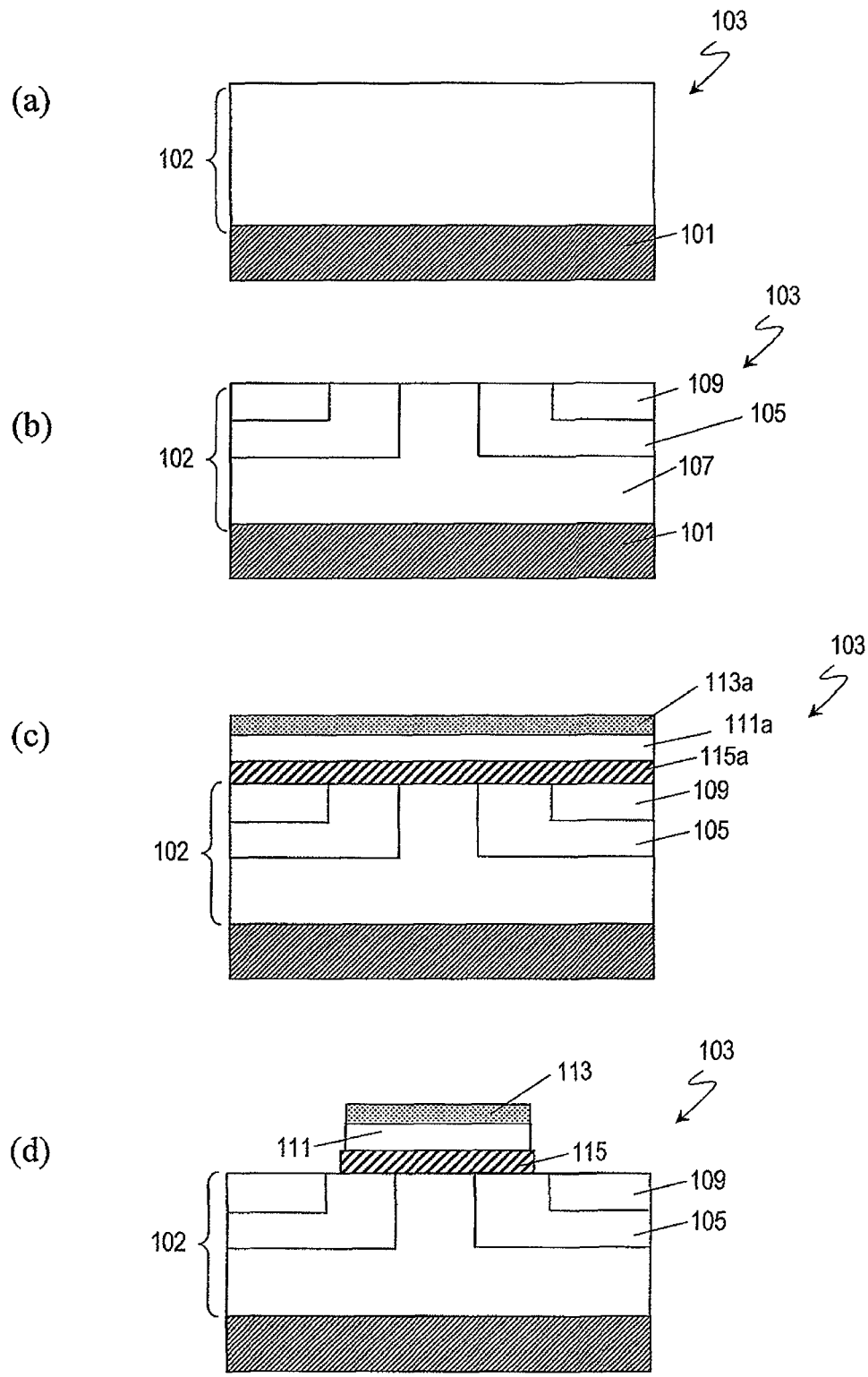
FIG. 3 (a)-(d) are cross-sectional views illustrating, step-by-step, a method for manufacturing a semiconductor device according to the first embodiment of the present invention.

Note that as a result of the metal diffusing into the side wall of the channel layer 115 to form the metal silicide layer, the position of the end portion of the channel layer 115 retreats inwardly from the position of the end portion of the channel layer 115 after patterning shown in FIG. 3($d$), and the width of the channel layer 115 along the channel direction is smaller than that as formed (FIG. 3($d$)). The width of the channel layer 115 (the position of the end portion) after silicification can be controlled by adjusting the thickness and the silicification conditions of the metal film 117. The width of the channel layer 115 is in some cases less than or equal to the width of the gate electrode 113. Preferably, it is generally equal to the width of the gate electrode 113. That is, it is preferred that the end portion of the channel layer 115 after silicification is generally aligned with the end portion of the gate electrode 113 as seen from the direction perpendicular to the principal surface of the substrate 101. Note that if the end portion of the channel layer 115 is located on the outer side of the end portion of the gate electrode 113, it is difficult to control the depletion layer in a portion of the channel layer 115 that is not located under the gate electrode 113 (a portion where the channel is not formed). Therefore, when applied to a normally-OFF-type MISFET, the ON resistance may be high.

Figure 4:
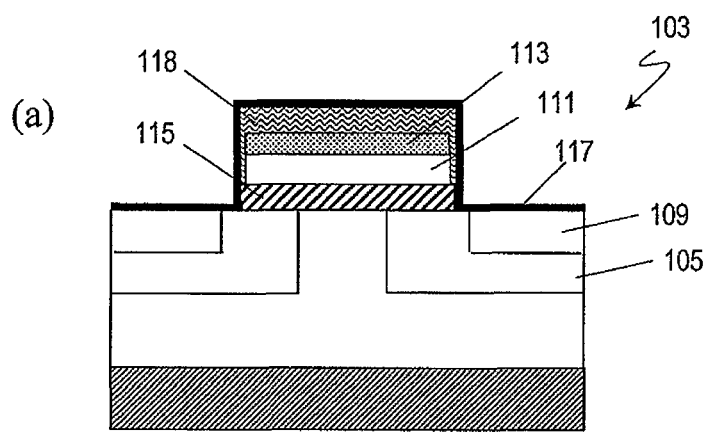
FIGS. 4 (a) and (b) are cross-sectional views illustrating, step-by-step, the method for manufacturing a semiconductor device according to the first embodiment of the present invention.
Figure 4:
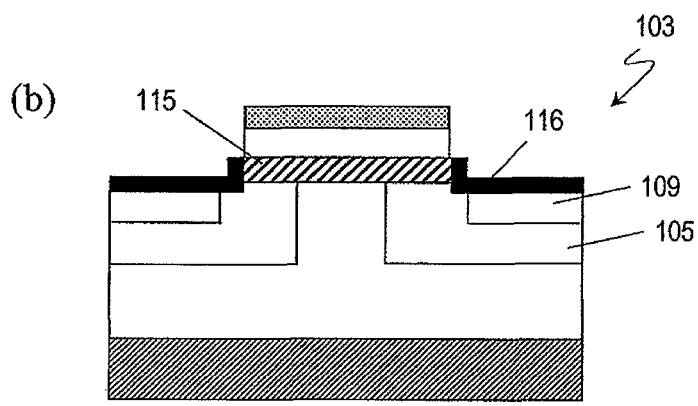

If the source electrode 116 is formed using the step shown in FIG. 4, the height of the upper surface of the source electrode (metal silicide) 116 (the height from the principal surface of the substrate 101) is less than or equal to the height of the lower surface of the gate insulating film 111. Therefore, it is no longer necessary to design while taking into consideration the gap between these electrodes so that the source electrode 116 and the gate electrode 113 do not come into contact with each other. Therefore, by generally aligning the end portion of the channel layer 115 after silicification with the end portion the gate electrode 113 as seen from the direction perpendicular to the principal surface of the substrate 101 as described above, the channel formation region of the channel layer 115 and the source electrode 116 can be in contact with each other. Such a configuration is suitably applied particularly to normally-OFF-type MISFETs.

Figure 5:
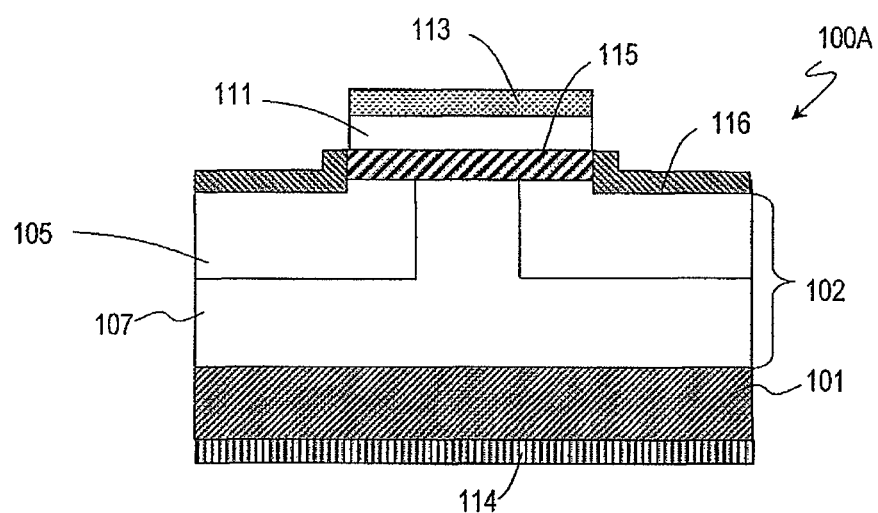
FIG. 5 A schematic cross-sectional view of another semiconductor device according to the first embodiment of the present invention.

The configuration of the semiconductor device 100 of the present embodiment is not limited to the configuration shown in FIG. 1. For example, no contact region may be formed in the body region 105 as shown in FIG. 5. Also with a semiconductor device 100A shown in FIG. 5, since the source electrode 116 is formed so as to be in contact with the channel layer 115, it is not necessary to form the source region in the body region 105. Moreover, since the source electrode 116 and the body region 105 are in contact with each other, the potential of the body region 105 can be more stabilized. Particularly, if the end portion of the source electrode 116 is in contact with the body region 105 as shown in the figure, the potential of the portion of the body region 105 that is located in the vicinity of the end portion of the channel layer 115 can be more effectively stabilized. Thus, it is possible to reduce the parasitic resistance as compared with conventional techniques.

EXAMPLES AND REFERENCE EXAMPLE

Next, the parasitic resistance R occurring in the body region and the characteristics of semiconductor devices of examples and a reference example will be described.

<Parasitic Resistance R Occurring in Body Region>

Figure 6:
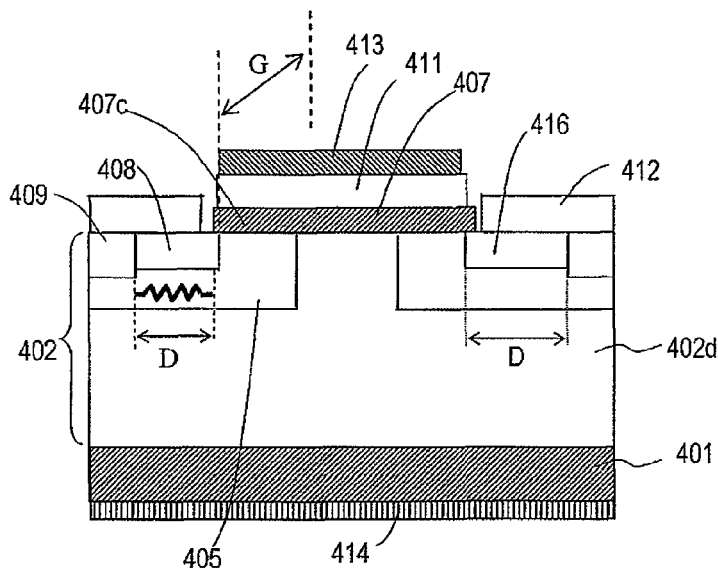
FIG. 6 (a)-(c) are cross-sectional views showing semiconductor devices of Reference Example 1, Example 1 and Example 2, respectively.
Figure 6:
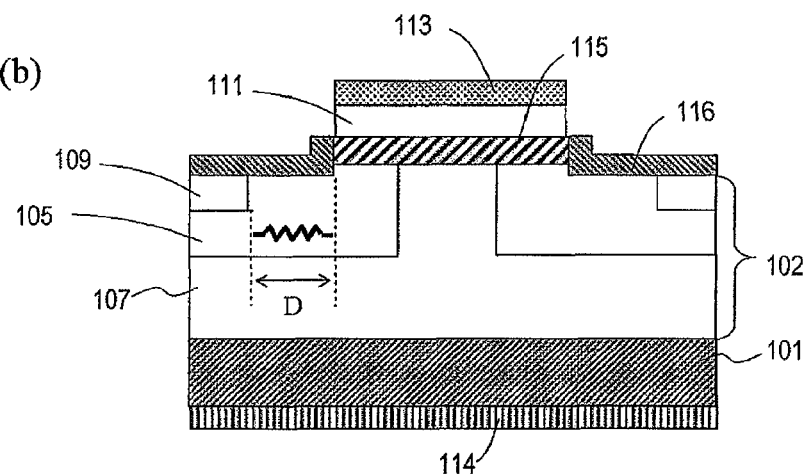
Figure 6:
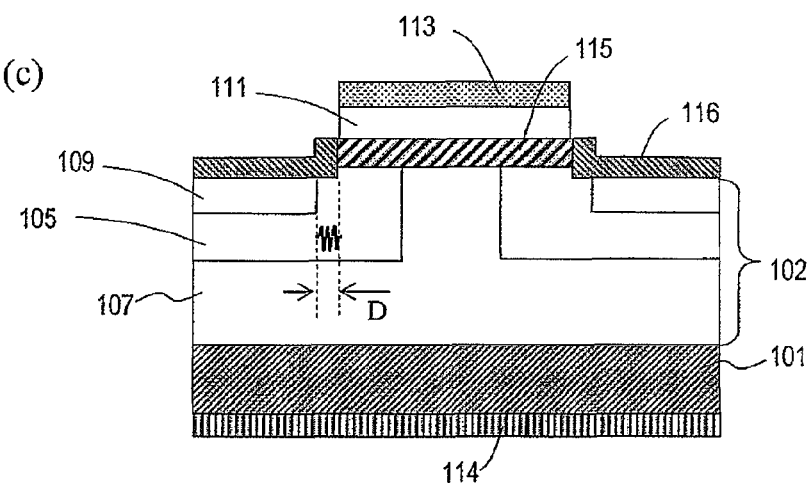

FIG. 6($a$) is a cross-sectional view of a MISFET of Reference Example 1. FIGS. 6($b$) and 6($c$) are cross-sectional views of MISFETs of Examples 1 and 2, respectively. For the sake of simplicity, like components to those of FIG. 8 are denoted by like reference numerals in FIG. 6($a$) and like components to those of FIG. 1 are denoted by like reference numerals in FIGS. 6($b$) and 6($c$), and these components will not be described.

Reference Example 1 shown in FIG. 6($a$) has a similar configuration to that of the conventional MISFET described above with reference to FIG.

In the MISFET of Reference Example 1, a depletion layer is formed by the PN junction between the body region 405 and the source region 416 in the body region 405 as described above. Assuming that the concentration of the body region 405 is $1\times10^{18}$ cm$^{-3}$ and the thickness thereof is 300 nm, and the concentration of the source region 416 is $1\times10^{-19}$ cm$^{-3}$ and the thickness thereof is 200 nm, the thickness of the depletion layer is about 30 nm. Thus, the thickness of the body region 405 where a depletion layer is produced is substantially 270 nm under the source region 416. The sheet resistance is in inverse proportion to the thickness of the body region 405 if the resistivity is the same. Therefore, assuming that the sheet resistance of the body region 405 where no depletion layer is formed is 10 kΩ/□, the sheet resistance of the body region 405 in which a depletion layer having a thickness of 30 nm is formed increases by about 10%, in inverse proportion to the effective thickness of the body region 405, to be 11 kΩ/□.

It is also assumed that the distance D between the contact region 409 and the channel formation region 407*c* is 1 μm, and the gate length (the width of the gate surface) is 3 μm. The distance D corresponds to the width of the source region 408. In Reference Example 1, the parasitic resistance R occurring due to the depletion layer and the distance D in the body region 405 is 33 kΩ (=11 kΩ/□×3 μm×1 μm).

Note that the thickness of the depletion layer depends on the concentrations of the body region 405 and the source region 416. As the concentration of the body region 405 is lower, or as the concentration of the source region 416 is higher, the thickness of the depletion layer increases, thereby increasing the sheet resistance of the body region 405 in which the depletion layer is formed.

Example 1 shown in FIG. 6(*b*) has a similar configuration to that of Reference Example 1 except that no source region is formed in the body region 105 and that the source electrode 116 and the channel layer 115 are in contact with each other. In Example 1, since there is no source region, the depletion layer is not produced in the body region 105. Therefore, the sheet resistance of the body region 105 is 10 kΩ as it is not increased by the depletion layer. In Example 1, as in Reference Example 1, the parasitic resistance R is 30 kΩ (=10 kΩ/□×3 μm×1 μm), assuming that the distance D is 1 μm and the gate length (the width of the gate surface) is 3 μm.

Example 2 shown in FIG. 6(*c*) has a similar configuration to that of Example 1. Note however that the distance D is smaller than the distance D in Example 1 and is set to 100 nm. Also in Example 2, as in Example 1, the sheet resistance of the body region 105 is 10 kΩ, for example. Assuming that the distance D is 100 nm and the gate length (the width of the gate surface) is 3 μm, the parasitic resistance R is 3 kΩ (=10 kΩ/□×3 μm×100 nm).

In Example 2, the contact region 109 and the gate electrode 113 are placed so that a predetermined distance D is obtained. In this case, although it is necessary to take into consideration the alignment precision, it is not necessary to form the source region, thereby providing an advantage because the arrangement of the contact region 109 and the gate electrode 113 can be set arbitrarily.

As can be seen from this result, in Examples 1 and 2, no source region is provided, and it is therefore possible to suppress the increase in the sheet resistance due to the depletion layer, and to reduce the parasitic resistance R as compared with Reference Example 1. In Example 2, the distance D is suppressed to be smaller than Example 1, and it is therefore possible to more effectively reduce the parasitic resistance R. Specifically, the parasitic resistance R of the semiconductor device of Example 2 is reduced to, for example, 1/10 or less of the parasitic resistance of Reference Example 1. Therefore, it can be seen that the parasitic resistance R can be more reduced as the distance D between the contact region 109 and the channel formation region is smaller.

<Characteristics of Semiconductor Devices of Examples and Reference Example>

First, based on the presence/absence of the gate voltage applied to the MISFETs of Examples 1 and 2 and Reference Example 1, the switching characteristics obtained when these MISFETs are turned ON/OFF were studied.

As a result, it is expected that the switching time for the ON/OFF operation is shorter for the MISFETs of Examples 1 and 2 than for the MISFET of Reference Example 1.

The reason for this is believed to be as follows. With the MISFET of Reference Example 1, the n-type source region 416 is present between the p-type contact region 409 and the channel layer 407 in addition to the contact resistance of the p-type contact region 409 being high, and it is therefore not possible to completely fix the reference potential of the body region 405 in the vicinity of the channel layer 407. Therefore, there is a delay on the response to the ON/OFF operation of the gate voltage during the switching operation due to the influence of the parasitic voltage present in the body region 405. In contrast, with the MISFETs of Examples 1 and 2, no source region is present in the body region 105, and the source electrode 116 is in contact with the body region 105 in the vicinity of the channel layer 115, and it is therefore possible to significantly reduce the parasitic resistance R. As a result, the potential of the body region 105 in the vicinity of the channel layer 115 can be fixed at the reference potential. Therefore, it is possible to improve the switching speed as compared with the MISFET of Reference Example 1.

The switching time constant for the MISFET ON/OFF operation is normally derived in proportion to the product between the parasitic capacitance and the parasitic resistance R. With the parasitic capacitance being equal, the switching speed will be in proportion to the parasitic resistance R. Therefore, in Examples 1 and 2, since the parasitic resistance R is smaller than in Reference Example 1, it is possible to realize a high switching speed. Particularly, in Example 2, it is possible to more effectively increase the switching speed.

A study on the ON resistances of the semiconductor devices of the examples and the reference example shows that the ON resistances of the MISFETs of Example 1 and Reference Example 1 are generally equal to each other, and the current-voltage characteristics thereof are generally equal to each other. The reason why the ON resistances are generally equal to each other is believed to be as follows. While there is a source region in between in Reference Example 1 and the contact resistance is therefore lower than Example 1, the source region has a small sheet resistance in Example 1, and as a result, the ON resistances are generally equal to each other. In the MISFET of Example 1, since the body region 105 and the source electrode 116 are in contact with each other in the vicinity of the channel layer 115, it is unlikely that a depletion layer is formed extending from the body region 105 into the channel layer 115 in an ON state, and there is no increase in the ON resistance due to such a depletion layer. Note that since the parasitic resistance R is significantly reduced in the MISFET of Example 2, the ON resistance can be suppressed to be smaller as compared with Reference Example 1 and Example 1.

Moreover, Example 2 also has an advantage that the size of the unit cell can be reduced because the distance D is suppressed to be small.

In the MISFET of Reference Example 1, assuming that the size of each unit cell is 10 μm×10 μm (the arrangement pitch of unit cells: 10 μm), the area of one unit cell is 100 μm². Of the 10 μm which is the width of the unit cell, the (two) portions corresponding to the distance D account for 2 μm in total. In contrast, in Example 2, since the total length of the portion of the width of the unit cell corresponding to the distance D can be reduced to 200 nm, the arrangement pitch of unit cells can be reduced to 8.2 μm. In this case, the area of one unit cell is about 67 μm², and the degree of integration of unit cells can be increased by up to about 1.5 times that of Reference Example 1. Therefore, the current density can be increased by about 1.5 times the current density of Reference Example 1. That is, the ON resistance can be reduced to about ⅔ the ON resistance of Reference Example 1.

As described above, if the present invention is applied to an accumulation channel-type MISFET, it is possible to prevent an increase in the parasitic resistance in the body region due to the depletion layer from the PN junction between the source region and the body region. It is also possible to stabilize the potential of the body region in the vicinity of the channel layer generally at the reference potential, without increasing the ON resistance. Thus, it is possible to reduce the parasitic resistance in the body region and to increase the switching speed. Moreover, since it is not necessary to form a source region, it is possible to set the distance between the channel formation region and the contact region to be smaller than that with conventional techniques and to more effectively reduce the parasitic resistance in the body region. By not forming the source region, it is possible to increase the packing density of unit cells and to reduce the ON resistance. According to the present invention, it is possible to manufacture such semiconductor devices as described above without complicating the manufacturing process.

The semiconductor device of the present invention is not limited to the semiconductor device of the embodiment described above. While Ni and silicon carbide are allowed to react with each other to form the source electrode 116 made of Ni silicide in the embodiment above, another metal material (e.g., Ti and Al) which can form an ohmic junction with a silicon carbide layer, instead of Ni, and silicon carbide may be allowed to reach with each other to form a source electrode made of another metal silicide.

While a 4H—SiC substrate is used as the substrate 101 in the embodiment above, other crystal planes (the (11-20) plane, the (1-100) plane, etc.), and SiC substrates of other polytypes (e.g., 6H—SiC, 15R—SiC, etc.) may be used. Where a 4H—SiC substrate is used, the silicon carbide layer 102 may be formed on the Si plane side and the drain electrode 114 on the C-plane side, or the silicon carbide layer 102 may be formed on the C-plane side and the drain electrode 114 on the Si plane side.

While the semiconductor device of the embodiment above is of an n-channel type, but it may be of a p-channel type. With a p-channel type semiconductor device (MISFET), the conductivity type of the SiC substrate 101, the drift region 107 and the channel layer 115 is the p type, and the conductivity type of the body region 105 and the contact region 109 is the n type.

Moreover, while the SiC substrate 101 of the same conductivity type as the silicon carbide layer 102 is used to manufacture a MISFET in the embodiment above, an SiC substrate of a different conductivity type from the silicon carbide layer 102 may be used to manufacture an insulated gate bipolar transistor (IGBT). Also when an IGBT is manufactured, it is possible to obtain similar advantages to those of the embodiment above by placing the source electrode and the body region so that the end portion of the source electrode (referred to also as the emitter) is in contact with the body region and, in a case of an accumulation channel-type, so that the source electrode is in contact with the channel layer.

INDUSTRIAL APPLICABILITY

The present invention can be widely applicable to semiconductor devices using silicon carbide and apparatuses having the same. Particularly, if it is applied to a power semiconductor device, it is possible to realize a low-loss high-speed switching operation, as expected from desirable physical property values of silicon carbide.

REFERENCE SIGNS LIST 100, 400 Semiconductor device (vertical MISFET)
100U, 400U Unit cell
101, 401 Semiconductor substrate (silicon carbide substrate)
102, 402 Silicon carbide layer (epitaxial layer)
103 Epitaxial substrate
105, 405 Body region
107, 402d Drift region
109, 409 Contact region
111, 411 Gate insulating film
116, 412 Source electrode
117 Metal film
118 Protection film
113, 413 Gate electrode
114, 414 Drain electrode
115, 407 Channel layer
115c, 407c Channel formation region

The invention claimed is:

1. A semiconductor device, comprising:
a substrate including a principal surface and a reverse surface;
a silicon carbide layer placed on the principal surface of the substrate, including a body region of a first conductivity type placed in a surface region of the silicon carbide layer, and a drift region of a second conductivity type;
a channel layer of the second conductivity type formed by silicon carbide and placed on the body region and the drift region on a surface of the silicon carbide layer;
a gate insulating film placed on the channel layer;
a gate electrode insulated from the silicon carbide layer by the gate insulating film;
a source electrode provided on the silicon carbide layer; and
a drain electrode provided on the reverse surface of the substrate, wherein:
the source electrode is in direct contact with the body region and the channel layer; and
a second conductivity type impurity concentration on a surface of the silicon carbide layer that is in direct contact with the source electrode is less than or equal to a second conductivity type impurity concentration of the channel layer.

2. The semiconductor device according to claim 1, wherein an end portion of the source electrode is in contact with the body region.

3. The semiconductor device according to claim 1, wherein the source electrode is in contact with a side wall of the channel layer.

4. The semiconductor device according to claim 1, wherein the silicon carbide layer does not have a source region of the second conductivity type, the source region being placed so as to connect the source electrode and the channel layer to each other and having a lower resistance than the channel layer.

5. The semiconductor device according to claim 1, wherein the source electrode is not in contact with a semiconductor region containing an impurity of the second conductivity type at a higher concentration than the channel layer.

6. The semiconductor device according to claim 1, wherein the channel layer includes a channel formation region that is in contact with the body region and located under the gate electrode, and the source electrode is in contact with the channel formation region.

7. The semiconductor device according to claim 1, wherein the source electrode contains a metal silicide, and a height from the principal surface of the substrate to an upper surface of the metal silicide is less than or equal to a height from the principal surface of the substrate to a lower surface of the gate insulating film.

8. The semiconductor device according to claim 1, wherein:
- the silicon carbide layer further includes a contact region placed within the body region, containing an impurity of the first conductivity type at a higher concentration than the body region, and electrically connected to the body region; and
- the source electrode is in contact with the contact region.

9. The semiconductor device according to claim 8, wherein:
- the channel layer includes a channel formation region that is in contact with the body region and located under the gate electrode; and
- a distance D between a contact region-side end portion of the channel formation region and a channel layer-side end portion of the contact region is 100 nm or more and less than 500 nm in a plane parallel to the principal surface of the substrate.

10. The semiconductor device according to claim 1, wherein the source electrode contains at least one metal of nickel, titanium and aluminum.

* * * * *